United States Patent
Li et al.

(10) Patent No.: US 11,923,205 B2
(45) Date of Patent: Mar. 5, 2024

(54) METHOD FOR MANUFACTURING SEMICONDUCTOR DEVICE

(71) Applicant: UNITED MICROELECTRONICS CORPORATION, Hsinchu (TW)

(72) Inventors: Kun-Ju Li, Tainan (TW); Ang Chan, Taipei (TW); Hsin-Jung Liu, Pingtung County (TW); Wei-Xin Gao, Tainan (TW); Jhih-Yuan Chen, Kaohsiung (TW); Chun-Han Chen, Hsinchu (TW); Zong-Sian Wu, Tainan (TW); Chau-Chung Hou, Tainan (TW); I-Ming Lai, Tainan (TW); Fu-Shou Tsai, Kaohsiung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/553,851

(22) Filed: Dec. 17, 2021

(65) Prior Publication Data
US 2023/0197467 A1 Jun. 22, 2023

(51) Int. Cl.
*H01L 21/76* (2006.01)
*H01L 21/47* (2006.01)
*H01L 21/762* (2006.01)

(52) U.S. Cl.
CPC ........ *H01L 21/47* (2013.01); *H01L 21/76237* (2013.01); *H01L 21/76251* (2013.01)

(58) Field of Classification Search
CPC ............... H01L 21/47; H01L 21/76237; H01L 21/76251
See application file for complete search history.

(56) References Cited

U.S. PATENT DOCUMENTS

| | | | |
|---|---|---|---|
| 5,918,139 A | 6/1999 | Mitani et al. | |
| 7,169,685 B2 | 1/2007 | Connell et al. | |
| 7,535,100 B2 | 5/2009 | Kub et al. | |
| 7,871,899 B2 | 1/2011 | Rinne et al. | |
| 8,298,916 B2 | 10/2012 | Vaufredaz et al. | |
| 8,329,048 B2* | 12/2012 | Zussy | H01L 21/76251 216/36 |
| 8,476,165 B2 | 7/2013 | Trickett et al. | |
| 8,765,578 B2 | 7/2014 | La Tulipe, Jr. et al. | |
| 9,372,406 B2 | 6/2016 | Chang et al. | |
| 10,580,823 B2 | 3/2020 | Zhang et al. | |
| 2008/0057612 A1* | 3/2008 | Doan | H01L 21/823481 438/57 |
| 2013/0115724 A1* | 5/2013 | Kearl | B41J 2/1603 438/21 |
| 2013/0328174 A1* | 12/2013 | La Tulipe, Jr. | H01L 25/50 257/629 |
| 2019/0287788 A1* | 9/2019 | Lin | H01L 21/02035 |

(Continued)

*Primary Examiner* — Ali Naraghi
*Assistant Examiner* — Siangluai Mang

(57) ABSTRACT

A method for manufacturing a semiconductor device includes: providing a wafer-bonding stack structure having a sidewall layer and an exposed first component layer; forming a photoresist layer on the first component layer; performing an edge trimming process to at least remove the sidewall layer; and removing the photoresist layer. In this way, contaminant particles generated from the blade during the edge trimming process may fall on the photoresist layer but not fall on the first component layer, so as to protect the first component layer from being contaminated.

7 Claims, 5 Drawing Sheets

(56) References Cited

U.S. PATENT DOCUMENTS

| | | | |
|---|---|---|---|
| 2021/0305200 A1* | 9/2021 | Lin | B23K 26/362 |
| 2022/0068745 A1* | 3/2022 | Li | H01L 23/5283 |
| 2022/0271023 A1* | 8/2022 | Wu | H01L 21/3043 |
| 2022/0293561 A1* | 9/2022 | Lo | H01L 25/0657 |

* cited by examiner

METHOD FOR MANUFACTURING SEMICONDUCTOR DEVICE

FIELD OF THE INVENTION

The present invention relates to a semiconductor technology, and more particularly to a method for manufacturing a semiconductor device.

BACKGROUND OF THE INVENTION

The manufacture of semiconductor components is used to produce integrated circuits applied in everyday electronic devices. The manufacturing process of semiconductor components is a multi-step sequence including lithography and chemical processing steps, during which electronic circuits are gradually produced on wafers made of semiconductor materials. After integrated circuits are produced on each wafer, two or a plurality of wafers may be bonded or stacked to each other. A wafer edge trimming process can be used to remove and/or prevent damage to the bonded wafers.

However, during the wafer edge trimming process, there may be contaminant particles. When the contaminant particles fall on the electronic circuit of the wafer, it will be difficult to remove the contaminant particles on the electronic circuit through the scrubbing process, thereby affecting the reliability of the semiconductor component.

SUMMARY OF THE INVENTION

The present invention provides a method for manufacturing a semiconductor device, wherein the component layer of the semiconductor device is protected from being contaminated, thereby avoiding the difficulty of the scrubbing due to contaminant particles attached on the component layer.

The method for manufacturing a semiconductor device provided by the present invention includes: providing a wafer-bonding stack structure having a sidewall layer and an exposed first component layer; forming a photoresist layer on the first component layer; performing an edge trimming process to at least remove the sidewall layer; and removing the photoresist layer.

In an embodiment of the present invention, a method for manufacturing the wafer-bonding stack structure includes: providing a first wafer structure and a second wafer structure, wherein the first wafer structure includes a first substrate and the first component layer formed on the first substrate, and the second wafer structure includes a second substrate and a second component layer formed on the second substrate; bonding the first wafer structure and the second wafer structure, wherein the first component layer and the second component layer face each other, and at least one interconnection layer is used to bond the first component layer and the second component layer; performing a thinning process to thin the first substrate; trimming the periphery of the stacked thinned first substrate, first component layer, interconnection layer, second component layer, to obtain a trimmed peripheral wall; depositing a protective layer to at least cover the thinned first substrate and the trimming peripheral wall, wherein the protective layer comprises a top layer and the sidewall layer, the top layer is arranged on the thinned first substrate, and the sidewall layer is arranged around the trimming peripheral wall; and removing the top layer and the thinned first substrate to expose the first component layer.

In an embodiment of the present invention, the interconnection layer includes a solder bonding structure, a metal-to-metal direct bonding structure, or a hybrid bonding structure.

In an embodiment of the present invention, the protective layer is a dielectric layer.

In an embodiment of the present invention, the steps of removing the top layer and the thinned first substrate includes: performing a planarizing process to remove the top layer, a portion of the thinned first substrate and a portion of the sidewall layer; and performing an etching process to remove the remaining thinned first substrate.

In an embodiment of the present invention, the etching process is a wet etching process.

In an embodiment of the present invention, a top edge of the sidewall layer is higher than an exposed surface of the first component layer.

In an embodiment of the present invention, the photoresist layer covers the exposed surface and the top edge of the sidewall layer.

In the method for manufacturing a semiconductor device according to an embodiment of the present invention, by the arrangement of the photoresist layer, contaminant particles generated from the blade during the edge trimming process may fall on the photoresist layer but not fall on the first component layer. In this way, the first component layer is protected from being contaminated, thereby avoiding the difficulty of the subsequent scrubbing due to contaminant particles attached on the first component layer.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
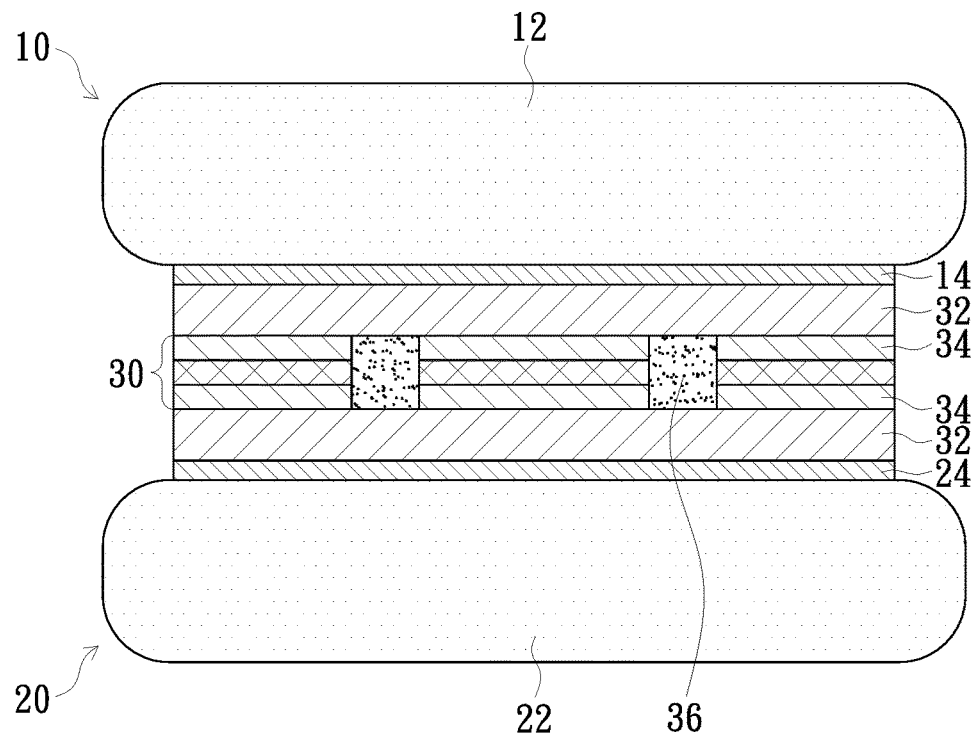
FIGS. 1A to 1I are schematic cross-sectional views of various stages of a method for manufacturing a semiconductor device according to an embodiment of the present invention.

FIGS. 1A to 1I are schematic cross-sectional views of various stages of a method for manufacturing a semiconductor device according to an embodiment of the present invention. As shown in FIG. 1A, a first wafer structure 10 and a second wafer structure 20 are provided, wherein the first wafer structure 10 includes a first substrate 12 and a first component layer 14 formed on the first substrate 12, and the second wafer structure 20 includes a second substrate 22 and a second component layer 24 formed on the second substrate 22. The first substrate 12 and the second substrate 22 are, for example, silicon substrates. In one embodiment, the second wafer structure 20 is used as the bottom wafer structure, the first wafer structure 10 is used as the top wafer structure, the first component layer 14 and the second component layer 24 face each other and at least one interconnection layer 30 is used to bond the first component layer 14 and the second component layer 24, so that the first wafer structure 10 and the second wafer structure 20 are stacked and bonded together. In on embodiment, the first wafer structure 10 and the second wafer structure 20 may respectively include the inter-metal dielectric (IMD) layer 32. The interconnection layer 30 may include a solder bonding structure, a metal-to-metal direct bonding structure, or a hybrid bonding structure. In one embodiment, the interconnection layer 30 may include the interlayer dielectric layer (ILD) 34 and a plurality of metal filled vias 36 in contact with the first wafer structure 10 and the second wafer structure 20.

Figure 1B:
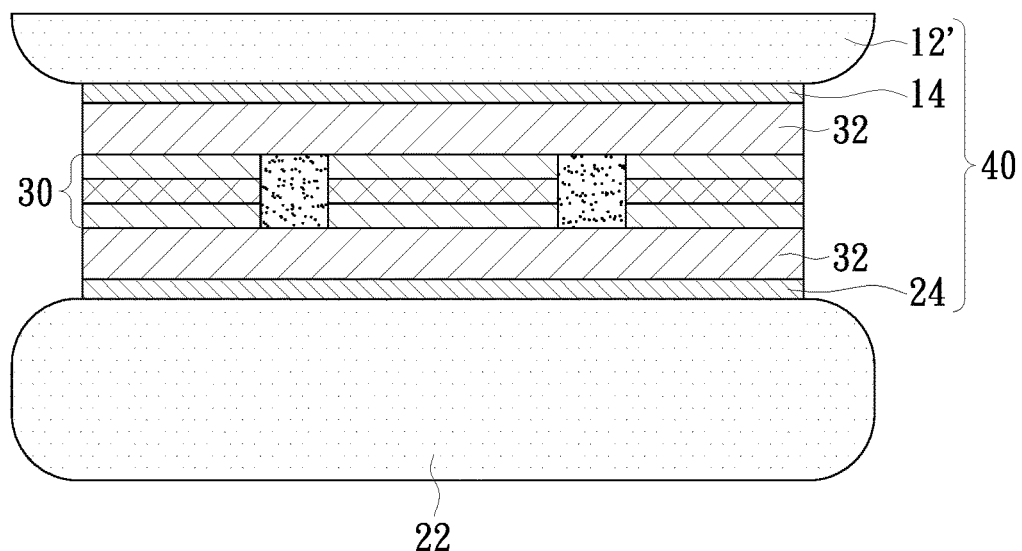

A thinning process (such as an etching process, a milling process, a grinding process or a polishing process) is performed on the first substrate 12 to reduce the thickness of the first substrate, as shown in FIG. 1B, whereby a thinned first substrate 12' is provided. FIG. 1B shows that a stack structure 40, including the thinned first substrate 12', the first component layer 14, the inter-metal dielectric (IMD) layers 32, the interconnection layer 30 and the second component layer 24, is arranged on the second substrate 22.

Figure 1C:
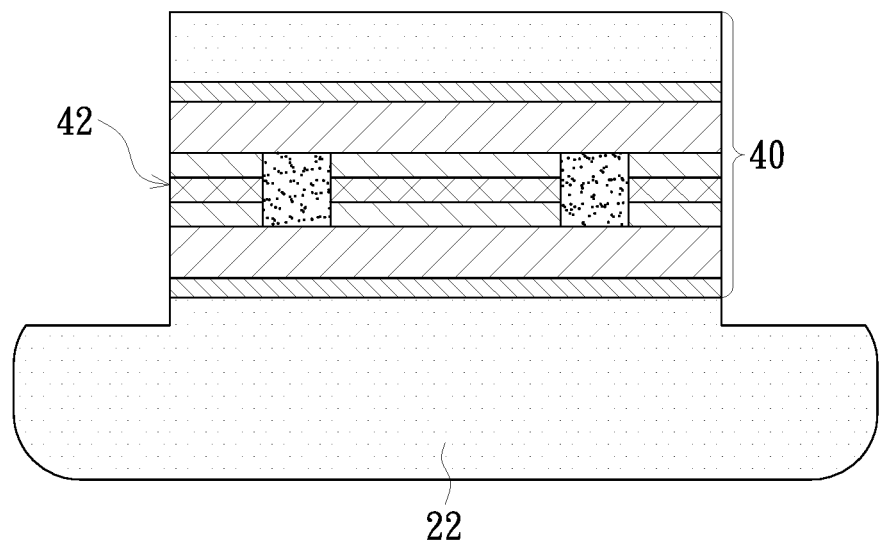

Then, as shown in FIG. 1C, the periphery of the stack structure 40 is trimmed to obtain a trimmed peripheral wall 42 around the stacked structure 40. In one embodiment, a portion of the second substrate 22 may also be trimmed.

Figure 1D:
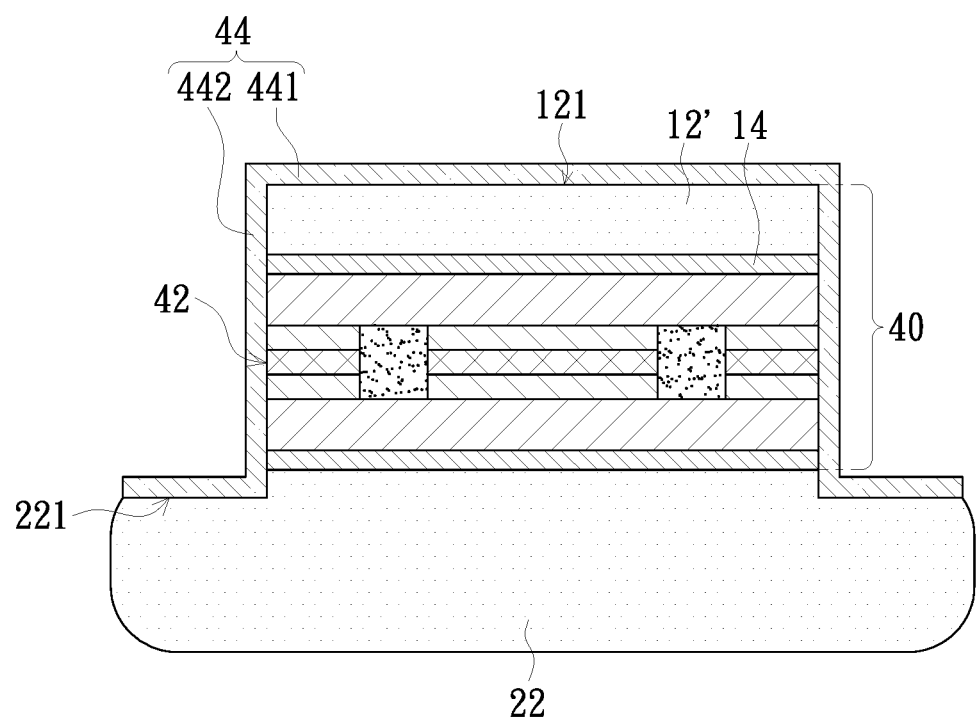

As shown in FIG. 1D, a protective layer 44 coats the entire stack structure 40, and the protective layer 44 covers the upper surface 121 of the thinned first substrate 12' and the trimming peripheral wall 42. In one embodiment, the protective layer 44 may include a top layer 441 and a sidewall layer 442, the top layer 441 is arranged on the upper surface 121 of the thinned first substrate 12', and the sidewall layer 442 is arranged around the trimming peripheral wall 42. Further, the protective layer 44 may also coat on the upper surface 221 of the second substrate 22. The protective layer 44 can prevent or reduce mechanical damage to the trimming peripheral wall 42 of the stacked structure 40 during the subsequent planarizing process and etching process. In one embodiment, the protective layer 44 may be a dielectric layer, and the protective layer 44 may contain or consist of an oxide film (e.g., $SiO_2$), a nitride film (e.g., SiN), or an oxynitride film (e.g., SiON). The protective layer 44 may be deposited by a spin-on process, or may be deposited by a chemical vapor deposition (CVD) process, a plasma-enhanced CVD (PECVD) process, or a physical vapor deposition (PVD) process.

Figure 1E:
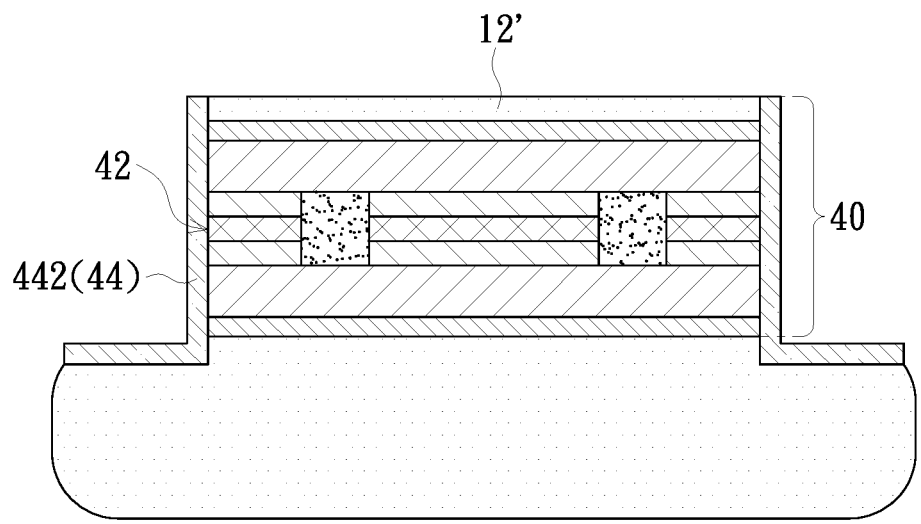
Figure 1F:
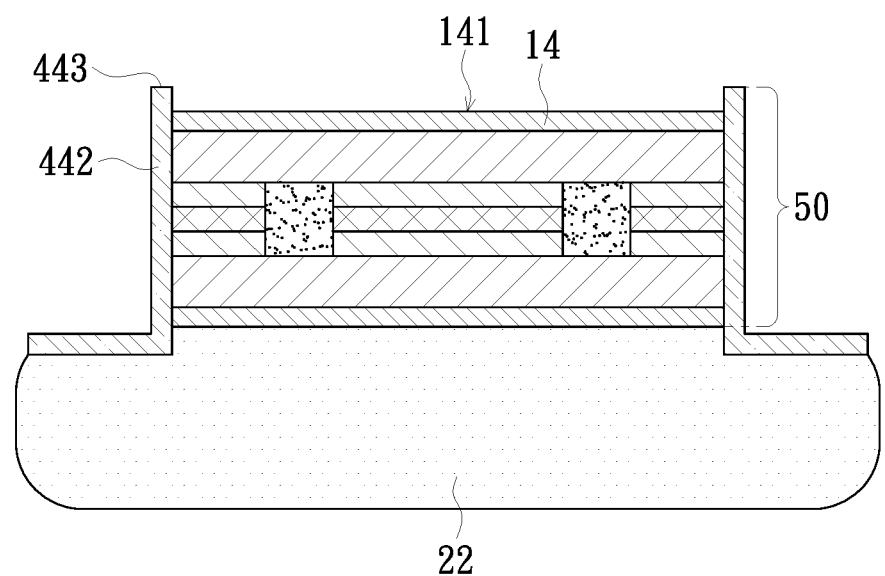

Then, the top layer 441 of the protective layer 44 and the thinned first substrate 12' are removed to expose the first component layer 14. FIG. 1E and FIG. 1F show the steps of removing the top layer 441 and the thinned first substrate 12'. As shown in FIG. 1E, a planarizing process is performed to remove the top layer 441 (shown in FIG. 1D) of the protective layer 44, a portion of the thinned first substrate 12' and a portion of the sidewall layer 442, whereby the thickness of the thinned first substrate 12' is reduced. In some examples, the planarizing process may be a mechanical grinding process or a chemical mechanical polishing (CMP) process. As shown in FIG. 1F, an etching process is performed to remove the remaining thinned first substrate 12'. In one embodiment, the etching process is a wet etching process. The wet etching process can be highly selective to removal of the silicon material of the remaining thinned first substrate 12' compared to removal of the material (e.g., SiO2) of the protective layer 44. In one embodiment, the wet etching process may be performed in a liquid bath containing TMAH (tetramethyl ammonium hydroxide), HNA (aqueous solution containing hydrogen fluoride, nitric acid, and acetic acid), or KOH (potassium hydroxide). Further, other liquid baths may be used that contain one or more etchants that provide good etching selectivity between the protective layer 44 and remaining thinned first substrate 12'.

As shown in FIGS. 1E and 1F, the presence of the sidewall layer 442 of the protective layer 44 may protect the trimming peripheral wall 42 of the stacked structure 40 during the planarizing process and the etching process. In one embodiment, after the remaining thinned first substrate 12' is removed, the first component layer 14 is exposed, and a top edge 443 of the sidewall layer 442 is higher than an exposed surface 141 of the first component layer 14, whereby a wafer-bonding stack structure 50 including the sidewall layer 442 and the exposed first component layer 14 is provided on the second substrate 22, as shown in FIG. 1F.

Figure 1G:
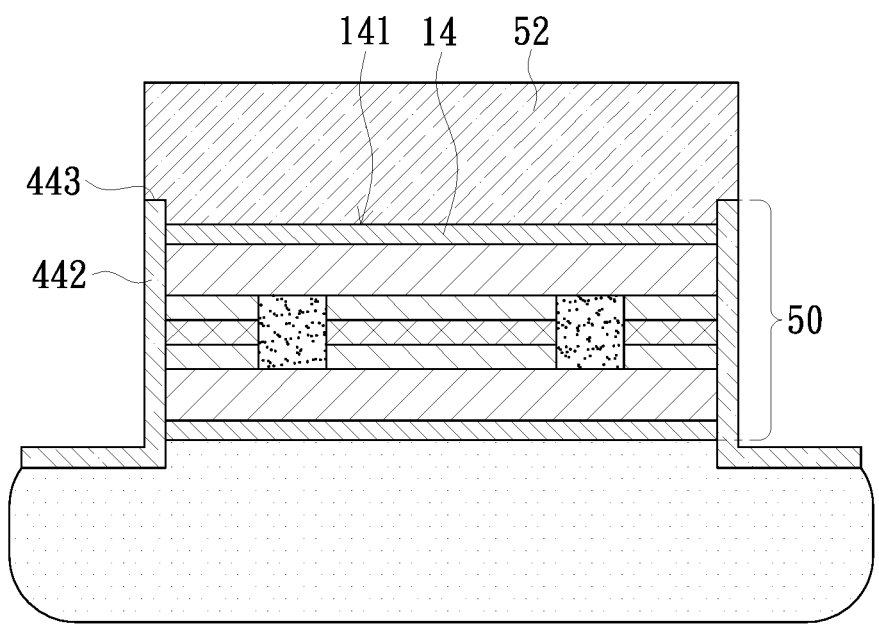

Then, as shown in FIG. 1G, a photoresist layer 52 is formed on the first component layer 14. In one embodiment, the steps of forming the photoresist layer 52, for example, are to spin coat a photoresist material on entire wafer-bonding stack structure 50, and then the edge of the wafer-bonding stack structure 50 may be rinsed by an organic solvent to remove excess material. This removal process is known as Edge Bead Removal (EBR). Whereby, the photoresist layer 52 may cover the exposed surface 141 of the first component layer 14 and the top edge 443 of the sidewall layer 442.

Figure 1H:
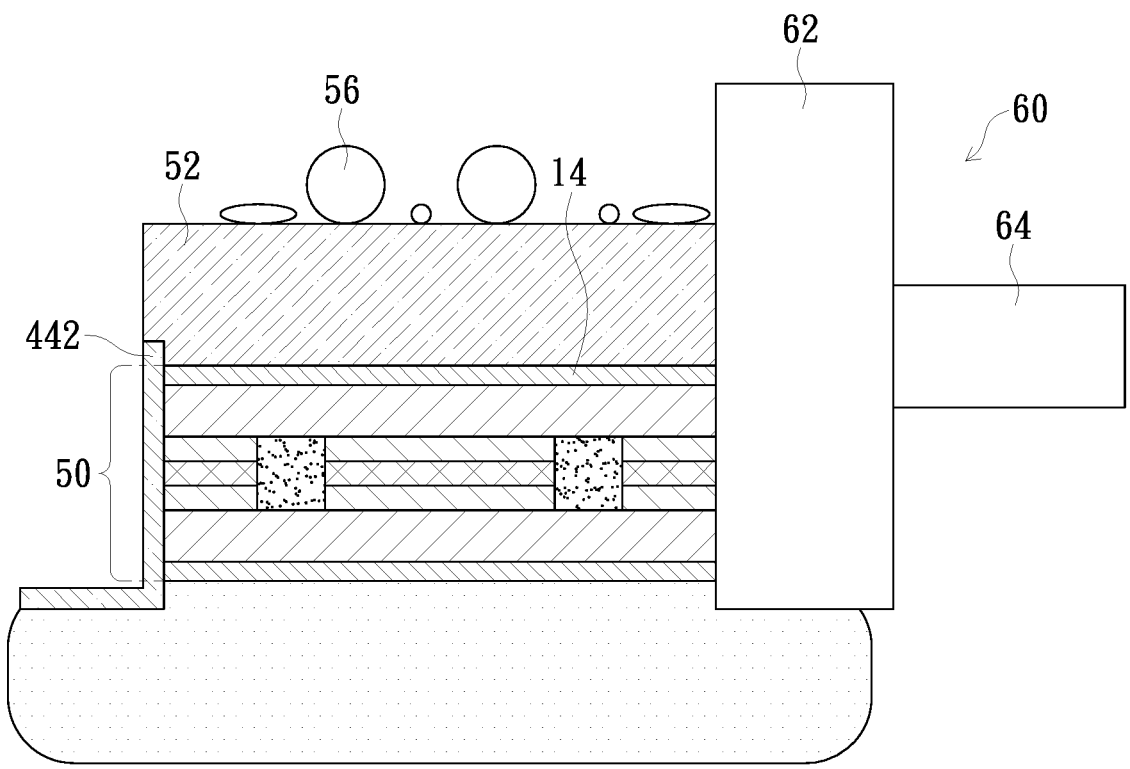

Then, an edge trimming process is performed to at least remove the sidewall layer 442. As shown in FIG. 1H, a wafer trimming apparatus 60 including a blade 62 and a spindle 64 connected with the blade 62 is used during the edge trimming process, wherein the blade 62 is configured to trim an edge portion of the wafer-bonding stack structure 50 and an edge portion of the photoresist layer 52, thereby defining a new sidewall 54 (shown in FIG. 1I) of the wafer-bonding stack structure 50' (shown in FIG. 1I). During the edge trimming process, as shown in FIG. 1H, contaminant particles 56 generated from the blade 62 may fall on the photoresist layer 52 but not fall on the first component layer 14 which is covered by the photoresist layer 52.

Figure 1I:
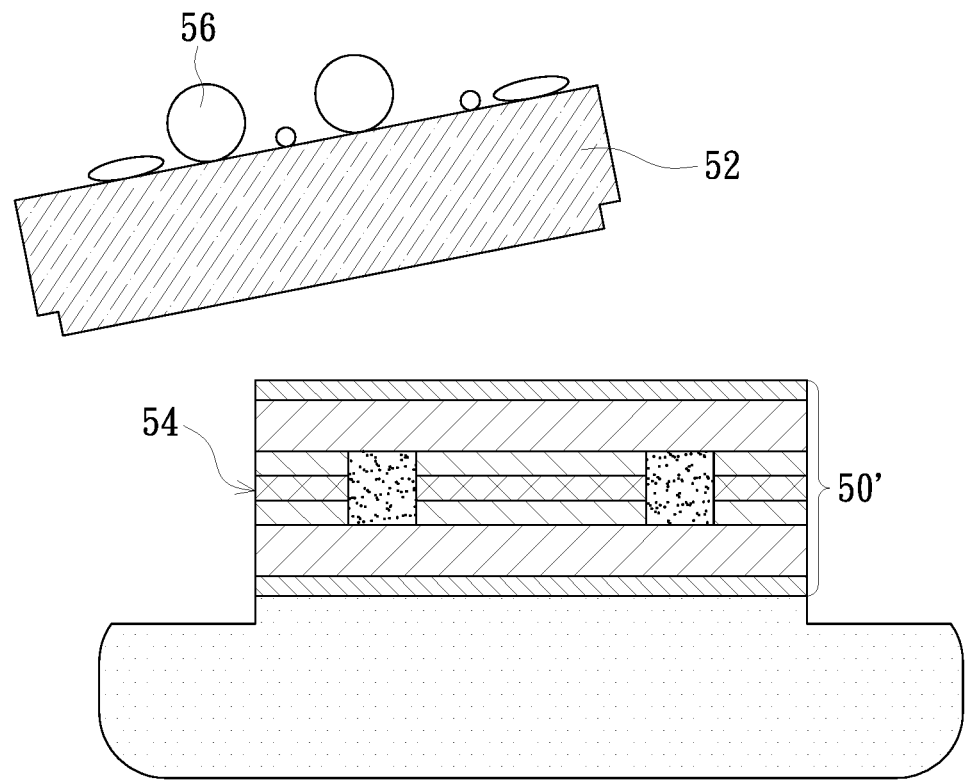

During the edge trimming process, the sidewall layer 442 is removed and as shown in FIG. 1I, the new sidewall 54 of the wafer-bonding stack structure 50' is presented. Then, the photoresist layer 52 is removed, wherein the contaminant particles 56 on the photoresist layer 52 are also removed. In one embodiment, the photoresist layer 52 is removed by, for example, ashing and/or wet strip processes.

In the method for manufacturing a semiconductor device according to the embodiments of the present invention, by the arrangement of the photoresist layer, contaminant particles generated from the blade during the edge trimming process may fall on the photoresist layer but not fall on the first component layer. In this way, the first component layer is protected from being contaminated, thereby avoiding the difficulty of the subsequent scrubbing due to contaminant particles attached on the first component layer.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a semiconductor device, comprising:
   providing a wafer-bonding stack structure comprising a sidewall layer and an exposed first component layer;
   forming a photoresist layer on the first component layer;
   performing an edge trimming process to at least remove the sidewall layer; and
   removing the photoresist layer,
   wherein a method for manufacturing the wafer-bonding stack structure comprises:
      providing a first wafer structure and a second wafer structure, wherein the first wafer structure comprises a first substrate and the first component layer formed on the first substrate, and the second wafer structure comprises a second substrate and a second component layer formed on the second substrate;
      bonding the first wafer structure and the second wafer structure, wherein the first component layer and the second component layer face each other, and at least one interconnection layer is used to bond the first component layer and the second component layer;
      performing a thinning process to thin the first substrate;
      trimming the periphery of the stacked thinned first substrate, first component layer, interconnection layer, second component layer, to obtain a trimmed peripheral wall;
      depositing a protective layer to at least cover the thinned first substrate and the trimming peripheral wall, wherein the protective layer comprises a top layer and the sidewall layer, the top layer is arranged on the thinned first substrate, and the sidewall layer is arranged around the trimming peripheral wall; and
      removing the top layer and the thinned first substrate to expose the first component layer.

2. The method for manufacturing the semiconductor device according to claim 1, wherein the interconnection layer comprises a solder bonding structure, a metal-to-metal direct bonding structure, or a hybrid bonding structure.

3. The method for manufacturing the semiconductor device according to claim 1, wherein the protective layer is a dielectric layer.

4. The method for manufacturing the semiconductor device according to claim 1, wherein steps of removing the top layer and the thinned first substrate comprise:
   performing a planarizing process to remove the top layer, a portion of the thinned first substrate and a portion of the sidewall layer; and
   performing an etching process to remove the remaining thinned first substrate.

5. The method for manufacturing the semiconductor device according to claim 4, wherein the etching process is a wet etching process.

6. The method for manufacturing the semiconductor device according to claim 1, wherein a top edge of the sidewall layer is higher than an exposed surface of the first component layer.

7. The method for manufacturing the semiconductor device according to claim 6, wherein the photoresist layer covers the exposed surface and the top edge of the sidewall layer.

* * * * *